United States Patent

Hayashi

Patent Number: 5,578,366
Date of Patent: Nov. 26, 1996

[54] METAL BASE BOARD AND ELECTRONIC EQUIPMENT USING THE SAME

[75] Inventor: Satoru Hayashi, Nagoya, Japan

[73] Assignee: Mitsubishi Denki Kabushiki Kaisha, Tokyo, Japan

[21] Appl. No.: 482,854

[22] Filed: Jun. 7, 1995

Related U.S. Application Data

[62] Division of Ser. No. 285,699, Aug. 4, 1994, abandoned.

[30] Foreign Application Priority Data

Aug. 6, 1993 [JP] Japan ................................ 5-196398

[51] Int. Cl.⁶ ........................................................ B32B 9/00
[52] U.S. Cl. ........................... 428/209; 428/901; 428/210; 361/750
[58] Field of Search ........................... 428/209, 210, 428/195, 901, 328, 418, 460, 458, 461, 419; 361/748, 750

[56] References Cited

U.S. PATENT DOCUMENTS

| | | |
|---|---|---|
| 4,307,147 | 12/1981 | Ohishi et al. |
| 4,492,730 | 1/1985 | Oishi ........................................ 428/901 |
| 5,057,903 | 10/1991 | Olla ............................................ 357/72 |
| 5,060,114 | 10/1991 | Feinberg et al. ........................ 361/387 |

*Primary Examiner*—Patrick Ryan
*Assistant Examiner*—Patrick Jewik
*Attorney, Agent, or Firm*—Sughrue, Mion, Zinn, Macpeak & Seas

[57] ABSTRACT

A metal base board comprising a metal plate, a circuit conductor section, and an insulating layer provided between the circuit conductor and the metal plate wherein the insulating layer comprises an organic insulating material with flaky inorganic fillers added therein and the flaky inorganic fillers are stacked in the insulating layer in a stratified state.

3 Claims, 4 Drawing Sheets

METAL BASE BOARD AND ELECTRONIC EQUIPMENT USING THE SAME

This is a divisional of application Ser. No. 08/285,699 filed Aug. 4, 1994 now abandoned.

FIELD OF THE INVENTION

This invention relates to a metal base board comprising a metallic base section, a circuit conductor section, and an insulating section provided between said circuit conductor section and the base section, and more particularly a metal base board used in a semiconductor device for power control which is incorporated in electronic equipment and generates a quantity of heat.

BACKGROUND OF THE INVENTION

In electronic control devices such as an invertor, servo amplifier, and spindle amplifier, a semiconductor device for power control comprises large capacity diodes, transistors, IGBTs, and MOSFETs. There is a so-called "DBC board" as a board for a circuit used in a electronic circuit generating a large quantity of heat such as a power control section. The DBC board comprises a metal plate for a conductor circuit, a ceramic insulating material, and a heat-conductive metal plate joined to a base of said ceramic insulating material. The metal plate used in the DBC board, for instance may be a copper plate. The ceramic insulating material used, for instance, may be alumina ceramic or alumina ceramic nitride. The heat-conductive metal plate, for instance, may be a copper plate. If such a material as alumina ceramic or nitriding alumina ceramic nitride, each with a high heat conductivity, is used as a ceramic insulating material, heat generated in a conductor circuit is rapidly transferred to a metal plate. Furthermore, as the material itself is ceramic, degradation of the material due to corona discharge is suppressed, and also the resistance against electric discharge is improved.

In the DBC board, however, as a coefficient of thermal expansion of the ceramic insulating material layer is different from that of the heat conductive metal plate layer, the heat cycle characteristic is rather poor, and cracks may be generated in the joining interface. Also, due to restrictions in the manufacturing process of ceramics, it is difficult to manufacture a large size plate. Typically, a ceramic product is limited to a dimension of around 150 mm×150 mm, using the conventional manufacturing method. In addition, the heating of materials at a high temperature is required in a process of manufacturing the conventional board, and as a result, the manufacturing process is very complicated with a high production cost.

To solve the problems with the DBC board as described above, use of a metal base board in which an insulating layer made of organic polymer and metallic foil, and adhered to a heat-conductive metal plate with an adhesive, has been proposed. As shown in FIG. 7, in this metal base plate 70, a circuit conductor 3 is formed via an insulating layer 2 comprising an organic insulating material on the upper surface of the heat-conductive metal plate 1, in which a granular inorganic filler material is added to an insulating layer 2. This configuration is disclosed, for instance, in the Japanese Patent Publication No. 6235/1971 and the Japanese Patent Publication No. 9650/1972. A discharge path 71 is seen between conductor 3 and plate 1.

Generally, organic polymer constituting an insulating layer has a substantially lower heat conductivity as compared to that of ceramics used in the DBC board, but the heat conductivity is raised by adding such an inorganic filler material as alumina or silica. Furthermore, the heat conductivity is raised to a desired level by reducing the thickness of the insulating layer to around 7% to 30% of that of the DBC board.

The technological documents relating to this invention includes the Japanese utility Model Laid Open Publication No. 106775/1991 disclosing a "metal base board", the Japanese Utility Model Laid Open Publication No. 73966/1988 disclosing an "heat-radiating insulating board", the Japanese Utility Model Laid Open Publication No. 98253/1987 disclosing a "printed-circuit board", the Japanese Patent Laid Open Publication No. 244180/1991 disclosing a "Metal base laminated plate", the Japanese Patent Laid Open Publication No. 27786/1990 disclosing a "low heat resistance circuit board", the Japanese Patent Laid Open Publication No. 232795/1989 disclosing a "Method of Manufacturing a Metal Base Board", and the Japanese Patent Laid Open Publication No. 232792/1990 disclosing a "Circuit Board".

Specifically, FIG. 1 or FIG. 4 in the Japanese utility Model Laid Open Publication No. 106775/1991 disclose a metal base board, in which lengthy inorganic fillers having a high heat conductivity are added in an organic insulating layer. The longitudinal surfaces thereof are facing the metal base side or are disposed at random. Because the inorganic fillers are added, heat radiated from parts mounted to the circuit conductor 3 of a metal base board 70 such as transistors, resistors, and capacitors, can effectively be transferred for emission to the outside.

Furthermore, as an organic polymeric insulating material is used in these metal base boards, a board which is larger than a DBC board can easily be manufactured with a low cost. Furthermore, there is no problem with the formation of cracks due to a heat cycle, as in a DBC board. For the reasons as described above, a metal base board having the configuration as described above is employed in a power circuit or other similar electric components which generate a large quantity of heat.

In the conventional type of metal base board as described above, however, a granular inorganic filler material is added to an organic polymeric material and the resultant mixture is used as an insulating material. However, the organic insulating layer is easily degraded when exposed to electric discharge, and the granular filler material does not work effectively. Namely, when degradation due to electric discharge proceeds up to the section with the granular inorganic filler material added therein, the degradation will continue to proceed along the section interface. As a result, the filler is not always effective in improving the electric discharge resistance characteristics.

In addition, as the thickness of the insulating layer is reduced to approximately 7% to 30% of the thickness of an ordinary DBC board to insure a desirable heat radiating characteristics, the insulating characteristics will be affected, under high voltage. First, it should be noted that, if the thickness of an insulating layer is increased, the resistance against electric discharge is improved, but the heat radiating characteristics becomes lower because heat generated in the circuit conductor is hardly transferred to the metal plate. Also, it should be noted that, although a conventional type of metal base board is generally used in applications requiring a relatively low operating voltage, i.e., AC 200 V or below, recently a metal base board is often used in applications where a high voltage in the class of 400 V or 600 V is always applied. Thus, under these two conditions, the insulating layer made of organic polymer will be degraded due to corona electric discharge, and the insulation, characteristics of the insulating layer will be damaged. In addition, as the thickness of a plate is small, the life until the final breakage of insulation will be short.

There are several reasons for this problem. First, if there is air on a surface along a conductor circuit section of a board, and even if the section has been processed with, for instance, resist or a silicon potting material, there exist void sections with air filled therein in the processed layer. Second, it is known that, if a high AC voltage is applied to the such air-filled void sections, corona electric discharge is generated. Third, in most organic polymeric materials a voltage at which corona electric discharge starts is in a range of approximately 400 to 500 V, although it depends on the thickness of each board. Not only in electronic equipment having a rated voltage of 400 V or less, but also in electronic equipment for which a rated voltage is more than 400 V, if a voltage of more than 400 V is loaded during its service operation in association with electronic control of such sections as a switch, corona electric discharge may occur.

Furthermore, although the "metal base board" disclosed in the Japanese Utility Model Laid Open Publication No. 106775/1991 is effective to provide thermal advantages, such as improvement of heat conductivity and reduction of coefficient of linear thermal expansion, degradation due to electric discharge will proceed along an interface, as previously described for the board shown in FIG. 7 with a granular inorganic filler material added therein when a degradation due to electric discharge reaches the fillers. For this reason, the filler can not improve a resistance against electric discharge of a metal base board.

SUMMARY OF THE INVENTION

It is an object of the invention to provide metal base boards which provide excellent heat-radiating characteristics as well as excellent resistance against electric discharge, and can be used even under a high voltage. It also is an object to provide electronic equipment which uses such metal base board and operates at high voltage.

In a metal base board according to the present invention and in the electronic equipment using the same, an insulating layer comprises an organic insulating material with flaky inorganic fillers added therein. The flat faces of said flaky inorganic fillers are aligned basically in parallel with the surfaces of the circuit conductor section and the base section so that the inorganic flaky filler plates are stacked in a stratified state. With this arrangement, even if corona discharge is generated in a void at the surface of a circuit conductor section or within an insulating layer and the organic insulating material is degraded, the degradation due to discharge is prevented or substantially suppressed in the section with flaky inorganic fillers added therein. As a result, the discharge resistant characteristics of the entire insulating layer are improved.

In a metal base board according to the present invention and the electronic equipment using the same therein, the insulating section comprises an organic insulating material with flaky inorganic fillers and a granular inorganic filler material, flat surfaces of the flaky inorganic fillers are aligned basically in parallel with surfaces of the circuit conductor section and the base section so that the materials can be stacked in a stratified state. As a result, even if discharge occurs in a void along the surface of the circuit conductor or in a void section within the insulating layer and the organic insulating material is degraded due to the discharge, the degradation due to discharge prevented or substantially is suppressed in the section with the flaky inorganic fillers added therein. Also, the discharge resistant characteristics of the entire insulating layer are improved, and because of the granular inorganic filler material, the heat conductivity of the insulating layer is raised. At the same time, the linear thermal expansion coefficient can be reduced, so that an insulating layer suited to conditions for practical use can be formed by changing a fixing ratio of the filler material.

In a metal base board according to the present invention and electronic equipment using the same, the insulating section comprises an insulating layer made of an organic insulating material with flaky inorganic fillers added therein and an insulating layer made of an organic insulating material with a granular inorganic filler material added therein, namely two layers in all, the surfaces of the flaky inorganic fillers are aligned basically in parallel with the surface of the circuit conductor and the base section so that the filler materials can be stacked in a stratified state. As a result, even if the organic insulating material is degraded due to electric discharge, the degradation due to electric discharge is suppressed in the section with the flaky inorganic fillers added therein, or the degradation due to the electric discharge itself is prevented, and the electric discharge resistant characteristics are improved. Further, because of the insulating layer comprising a granular inorganic filler material, the heat conductivity of the insulating layer is raised and also the linear thermal expansion coefficient can be reduced. With this arrangement, an insulating layer suited to conditions for practical use can be formed by changing a ratio of thickness between the two organic insulating layers.

In the metal base board according to the present invention and electronic equipment using the same, the insulating section comprises a plurality of insulating layers, each insulating layer comprises an organic insulating layer with a different type of flaky inorganic fillers each having a different average particle diameter respectively. Fillers belonging to at least any one type of the flaky inorganic filler materials are aligned basically in parallel with the surfaces of the circuit conductor and the base section so that the fillers can be stacked in a stratified state. As a result, even if electric discharge occurs in a section of the circuit conductor along the surface or in a void section within the insulating layer and the organic insulating material is degraded due to the electric discharge, the degradation due to electric discharge is suppressed in the section with the flaky inorganic fillers added therein, or the degradation due to electric discharge itself is prevented. In sum, the electric discharge resistant characteristics in the entire insulating layer are improved. Moreover, an insulating layer suited to conditions for practical use can be formed by changing a ratio of thickness between a plurality of organic insulating layers.

In the metal base board and electronic equipment using the same therein, the insulating section comprises an organic insulating material with multiple different types of flaky inorganic fillers each made of a different raw material, surfaces of the flaky inorganic filler materials are aligned basically in parallel with the surfaces of the circuit conductor section and the base section so that the filler materials can be stacked in a stratified state. For this reason, even if electric discharge occurs in a section of the circuit conductor along the surface or in a void within the insulating layer and the organic insulating material is degraded due to the electric discharge, the degradation due to electric discharge is suppressed in the section with the flaky inorganic fillers added therein, or the degradation due to electric discharge itself is prevented with the electric discharge resistant characteristics in the entire insulating layer improved. Furthermore, properties corresponding to the type of filler material can be given to the insulating layer, and for these reasons an insulation layer more suited to conditions for practical use can be formed.

In the board according to the present invention and electronic equipment using the same, the insulating section comprises a plurality of insulating layers, each layer comprises an organic insulating layer with flaky inorganic fillers each having a different particle diameter added therein respectively, surfaces of each flaky inorganic fillers are aligned basically in parallel with the surfaces of the circuit conductor section and the base section so that the fillers can be stacked in a stratified state. As a result, even if electric discharge occurs in a section of the circuit conductor along the surface or in a void within the insulating layer and the organic insulating material is degraded due to the electric discharge, the degradation due to electric discharge is suppressed in the section with the flaky inorganic fillers added therein, or the degradation due to electric discharge itself is prevented with the electric discharge resistant characteristics improved in the entire surface. Moreover, because properties corresponding to the type of filler material can be given to the insulation layer, an insulating layer suited to conditions for practical use can be formed.

Other objects and references of this invention will become understood from the following description with reference to the accompanying drawings.

DESCRIPTION OF THE EMBODIMENTS

Figure 1:
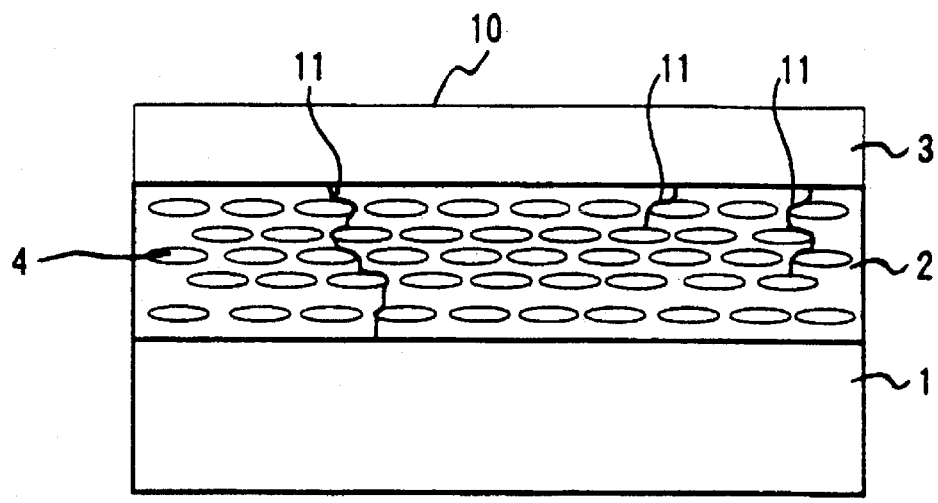
FIG. 1 is a view illustrating configuration of a metal base board according to the present invention.

Now description is made hereinafter for embodiments of metal base boards according to the present invention and electronic equipment using the same with reference to the related drawings. As shown in FIG. 1, a metal base board 10 has a circuit conductor 3 via an insulating layer 2 on a metal plate 1 with flaky inorganic fillers 4, the flakes thereof having a form like a flat plate, added in the insulating layer 2. Such a material as Fe, Al, Cu, SUS, or silicon steel, for example, can be used as a material for the metal plate 1, but Cu is used in this embodiment. As a material for the circuit conductor 3, such a material as Al or Cu, for example, can be used, but Cu is used in this embodiment.

In the insulating layer, an organic insulating material with flaky inorganic fillers added therein is used, and in this embodiment resin with flaky inorganic fillers each comprising an alumina filler (marketed by Showa Keikinzoku under the name of Low soda alumina L-13PC) added therein by 80 weight % against the resin is used. The flaky inorganic fillers are added in a quantity of 80% against the resin because, if the flaky inorganic fillers are mixed too significantly in the resin, the viscosity of the resin increases too much and the workability thus becomes low.

Specifically, epoxy resin and a diciandiamido curing agent are mainly used as an organic insulating material, and alumina flakes each having a size approximately 0.06 mm and the thickness from 0.002 to 0.003 mm are used as the flaky inorganic fillers 4. Furthermore the thickness of an insulating layer in a board is 0.12 mm, and about 20 to 30 flake layers are formed in the insulating layer 2.

The flakes in the flaky inorganic fillers may be circular, rectangular, polygonal, or of other form, so long as the materials are flat. Furthermore flat surfaces of each inorganic filler flake 4 in the organic insulating material are generally aligned in parallel with the surfaces of the circuit conductor 3 and the metal plate 1 so that the flaky inorganic fillers can be stacked in a stratified state. Namely, the flaky inorganic fillers are added so that as seen by the paths 11, any vector from a given point on the circuit conductor 3 to the metal plate 1 in the direction vertical to the circuit conductor 3 will intersect some of the flaky inorganic fillers.

In the insulating layer 2, various methods may be employed for aligning the flaky inorganic fillers in one direction. For instance, (1) powder of flaky inorganic fillers, each flake having a form like a flat plate, is added in an organic insulating material having a low viscosity, the mixture is applied several times to form a thin layer, and then the thin layer is cured; (2) the flaky inorganic fillers are aligned in one direction by making use of gravity; or (3) powder of flaky inorganic fillers, each flake having a form like a flat plate, is disposed on a metal plate, and then a layer of organic insulating material is applied so that it becomes impregnated with the flakes. In this embodiment, powder of flaky inorganic fillers 4, each flake having a form like a flat plate, are added to an organic insulating material having a low viscosity and is applied several times in a form of thin layers (10 to 20 µ/l time×10 times), and the thin layers are cured by loading pressure to and heating the thin layers in a vacuum.

Testing for the electric discharge resistant characteristics of the board obtained according to the method described above was carried out. In this testing for the resistance against electric discharge, samples were obtained by etching a 5 mm (width)×50 mm (length) conductive pattern at a center of a metal base board having outer dimensions of 200 mm (length)×150 mm (width). The thickness of the metal plate was 2 mm, the thickness of the organic polymeric insulating layer was 0.12 mm, and the thickness of the conductive layer was 0.1 mm.

In the test, industrial power (AC 2 kV and AC 3 kV, 60 Hz) was applied between the conductive pattern and the metal plate of the metal base board at a peripheral temperature of 100° C. The time required until the insulation was broken was measured. When an AC voltage is applied, air near the surface of the conductive pattern will result in a violent discharge of electricity. Results obtained in this test are shown in Table 1.

TABLE 1

|  | Thickness of Insulting Layer (μm) | Time until insul. Broken (Hr) | |
| --- | --- | --- | --- |
|  |  | 2 k V loaded | 3 k V loaded |
| Flaky Inorganic Filler Materials | 120 | 9500 | 4300 |
| Granular Inorganic Filler Materials | 120 | 250 | 80 |

As clearly shown in Table 1, the metal base board in which flaky inorganic fillers are used has far superior electric discharge resistant characteristics as compared to that of a conventional product (a metal base board in which a granular inorganic filler material is used). Namely, in a metal base board 10 having the configuration as described above, an electric discharge generated in the side of the circuit conductor 3 degrades the insulating layer 2, and the degradation proceeds up to the section with the flaky inorganic fillers 4 added in the insulating layer 2. As described above, surfaces of flaky inorganic fillers 4 each constituting a portion of the insulating layer 2 are aligned basically in parallel with the surfaces of the circuit conductor 3 and the metal plate 1, and in addition the fillers are stacked in stratified layers. With this structure, although electric discharge occurs in the flaky inorganic filler material section, progress of degradation is very slow because the flaky inorganic fillers 4 provide excellent electric discharge resistant characteristics. As a result, the performance as shown in Table 1 is provided. Namely, the metal base board having a circuit conductor 3 formed over the insulating layer 2 on the surface of the metal plate 1, in which the flaky inorganic fillers 4 are added in the insulating layer 2 with the surfaces of each flake of the flaky inorganic filler material 4 aligned generally in parallel with the surfaces of the circuit conductor 3 and the metallic body 1 and the aligned flakes 7 inorganic filler stacked in a stratified state, has superior electric discharge resistant characteristics as compared to that of a conventional type of board.

Semiconductor devices, such as transistors, resistors, and capacitors for power control which generate a large quantity of heat, are mounted on a metal base board having the configuration as described above to build a variety of electronic equipment.

Figure 2:
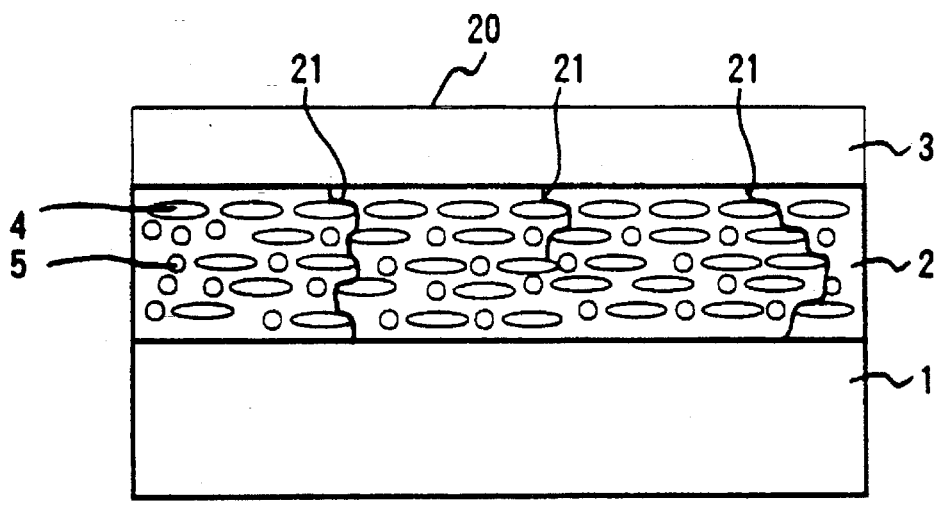
FIG. 2 is a drawing illustrating a metal base board according to the present invention.

Now description is made hereinafter of a second embodiment of the present invention. As shown in FIG. 2, a metal base board 20 has the circuit conductor 3 via the insulating layer 2 on the metal plate 1 with flaky inorganic filler materials 4 and a granular inorganic filler material added in the insulating layer 2. In this embodiment, a resin with flaky alumina inorganic fillers (marketed by Showa Keikinzoku under the name of Low soda alumina AL-13PC) by about 40 weight % against the weight of resin and granular inorganic filler materials (Alumina filler having a spheric form produced by Showa Denko) by about 50 weight % against the weight of resin added therein, respectively, is used.

In the organic insulating material with the flaky inorganic fillers 4 and the granular inorganic filler materials 5 added therein, the surfaces of the flaky inorganic fillers are aligned basically in parallel with the surfaces of the circuit conductor 3 and the metal plate 1, and are stacked in a stratified state. Namely, any vector in the insulating section 2 from a given point on the circuit conductor 3 to the metal plate 1 in a direction vertical to the circuit conductor 3, as seen by the paths 21, will intersect flakes in the flaky inorganic fillers 4.

Various methods can be employed for aligning the flaky inorganic fillers 4 in one direction. However, in this embodiment, the flaky inorganic filler 4 and a granular inorganic filler material 5 are added in powder form to an organic insulating material having a low viscosity. The mixture is applied several times in a form of thin layers. Then, the thin layer is cured in a vacuum by applying pressure and heat. As a result, the viscosity of the resin could be reduced to about 70% as compared to a case where only the flaky inorganic fillers 4 described in relation to the first embodiment was added, and also the workability could be improved. Accordingly, the viscosity of an insulating material can be reduced and also the linear thermal expansion coefficient as well as the heat conductivity can easily be adjusted in a manufacturing process.

Testing for the electric discharge resistant characteristics of the board obtained according to the method as described above was carried out in the same procedure as that in the first embodiment. The result of this testing are as shown in Table 2.

TABLE 2

|  | Thickness of Insulting Layer (μm) | Time until insul. Broken (Hr) | |
| --- | --- | --- | --- |
|  |  | 2 k V loaded | 3 k V loaded |
| Flaky + Granular Inorganic Materials | 120 | 7800 | 3080 |
| Granular Filler Materials | 120 | 250 | 80 |

As clearly shown in Table 2 above, for a metal base board with flaky alumina filler materials and granular alumina filler materials added in an organic insulating material thereof, the electric discharge resistant characteristics are substantially better as compared to that in the conventional products. The mechanism for improving the electric discharge resistant characteristics in this embodiment is basically the same as that in the first embodiment.

Electronic equipment are constructed by packaging semiconductor devices for power control, such as transistors, resistors, and capacitors, which generate a quantity of heat, on a metal base board having the configuration as described above.

Figure 3:
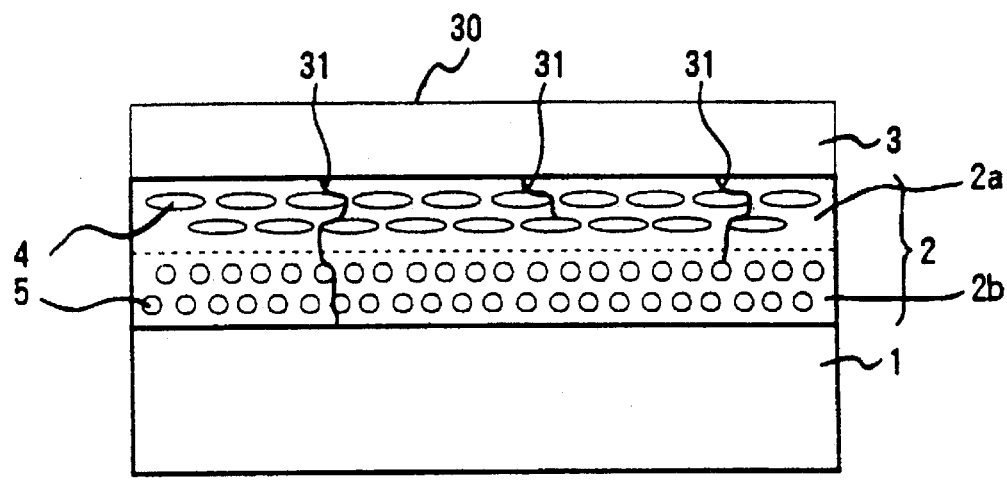
FIG. 3 is a view illustrating a metal base board according to the present invention.

Now description is made for a third embodiment of the present invention. As shown in FIG. 3, a metal base board has the circuit conductor 3 formed via the insulating layer 2 on the upper surface of the metal plate 1, the insulating layer 2 comprises a first insulating layer 2a and a second insulating layer 2b, the first insulating layer 2a is filled with the flaky inorganic filler materials 4, and the second insulating layer 2b is filled with the granular filler materials 5.

In the first insulating layer 2a, an organic insulating material such as an epoxy resin with the flaky inorganic filler materials 4 added therein is used. In this embodiment, alumina filler flaky inorganic fillers are added by about 80% against the weight of resin (available for Showa Keikinzoku under the name of Low soda alumina AL-13 PC).

In the second insulating layer 2b, an organic insulating material such as an epoxy resin with a granular inorganic filler material added in is used. In this embodiment, alumina filler granular inorganic fillers (Ultra-granular alumina, spheric product sold by Showa Denko) are added by about 90 weight % against the weight of resin.

Also, in the metal base board according to this embodiment, the first insulating layer 2a made of an organic insulating material with the flaky inorganic filler materials 4 added therein is formed in the insulating layer at the side adjacent the circuit board 3. This arrangement is effective for improving the electric discharge resistant characteristics thereof. In a manufacturing process, the second insulating layer 2b with the granular inorganic filler materials 5 added therein is first formed on the metal plate 1, then the first insulating layer 2a with the flaky inorganic fillers 4 added therein is formed, and finally the circuit conductor 3 is adhered.

surfaces of the flaky inorganic fillers 4 added in the first insulating layer 2a are aligned basically in parallel with the surfaces of the circuit conductor 3 and the metal plate 1 in the organic insulating material, and also the flaky inorganic fillers are stacked in a stratified state. Namely, the flaky inorganic fillers are added so that any vector from a given point on the circuit conductor 3 to the metal plate 1 in the direction vertical to the circuit conductor 3, as seen in paths 31, will intersect a flake in the flaky inorganic filler in the insulating section 2.

Various methods can be employed for aligning inorganic filler materials in one direction. In this embodiment, at first a powder of granular filler material 5 is added to an organic insulating material having a low viscosity, and the mixture is applied several times in a form of thin layer, which is cured to the thickness of 0.06 mm by applying pressure and heat. Furthermore, powder of the flaky inorganic filler material 4 is added in an organic insulating material having a low viscosity, and the mixture is applied several times in a form of thin layers, which are cured to the thickness of 0.06 mm by applying pressure and heat in a vacuum. Thus, an insulating layer having the total thickness of 0.12 mm is formed and the circuit conductor 3 is adhered thereto.

Testing for the electric discharge resistant characteristics of the board obtained as described above was carried out according to the same procedure as in the first and second embodiments above. The results of this testing are as shown in Table 3.

TABLE 3

|  | Thickness of Insulting Layer (μm) | Time until insul. Broken (Hr) | |
| --- | --- | --- | --- |
|  |  | 2 k V loaded | 3 k V loaded |
| 2-layer Structure Based on the Flaky and Granular Inorganic Filler Materials | 120 | 8800 | 3800 |
| Granular Inorganic Filler Materials | 120 | 250 | 80 |

As clearly shown in Table 3, the metal base board according to this embodiment is far superior in the electric discharge resistant characteristics as compared to that of the conventional products. The mechanism for improving the electric discharge resistant characteristics is basically the same as that in the first embodiment. However, as the thickness of the first insulating layer 2a with the flaky inorganic filler materials added therein is smaller as compared to that of the insulating layer in the first embodiment described above, the time until breakage of insulation becomes shorter.

Electronic equipment are built by packaging semiconductor devices for power control as transistors, resistors, and capacitors which generate a quantity of heat on the metal base board having the configuration as described above.

Figure 4:
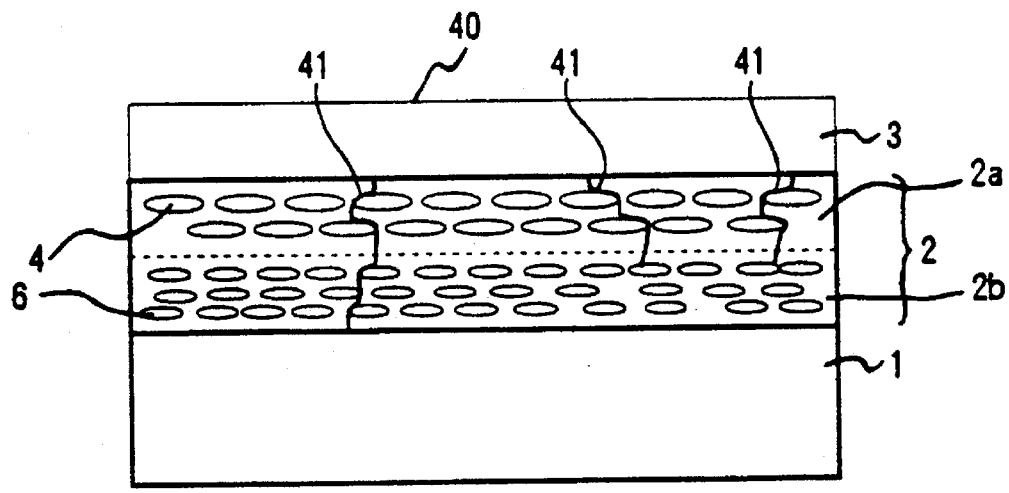
FIG. 4 is a view illustrating a metal base board according to the present invention.

Now description is made hereinafter for a fourth embodiment of the present invention. As shown in FIG. 4, a metal base board 40 has the circuit conductor 3 disposed the insulating layer 2 on the upper surface of the metal plate 1. The insulating layer 2 comprises the first insulating layer 2a and the second insulating layer 2b. The flaky inorganic fillers 4 are added in the first insulating layer 2a, and flaky inorganic fillers 6 having the average size different from that of the flaky inorganic fillers 4 added in the first insulating layer 2a are added in the second insulating layer 2b.

In the metal base board according to this embodiment, disposing the first insulating layer 2a made of an organic insulating material with the flaky inorganic filler materials 4 having a relatively large average size adjacent the circuit board 3 is effective in improving the electric discharge resistant characteristics of the assembly. Accordingly, at first the second insulating layer 2b with the flaky inorganic fillers 7 having a short average dimension is formed on the metal plate 1. Then the first insulating layer 2a with the flaky inorganic fillers 4 having a lengthy average size added therein is formed there on. Finally the circuit conductor 3 is adhered.

Surfaces of the flaky inorganic fillers 4 in the insulating layer 2a and the flaky inorganic fillers 6 in the second insulating layer 2b are aligned basically in parallel with the surfaces of the circuit conductors 3 and the metal plate 1, and the fillers are stacked in a stratified state. Accordingly, any vector in the insulating section from a given point on the circuit conductor 3 to the metal plate 1 in the direction vertical to the circuit conductor 3, as seen along paths 41 will intersect flakes in the flaky inorganic filler materials 4 and 6.

Also in this configuration, the electric discharge resistant characteristics are far better than that of conventional products. The mechanism for improving the electric discharge resistant characteristics in this embodiment and the method of aligning the direction of the inorganic filler materials are basically the same as those in the first and the third embodiments.

Semiconductor devices for power control such as transistors, resistors, and capacitors, which generates a large quantity of heat, are mounted on the metal base board having the construction as described above to build electronic equipment.

Figure 5:
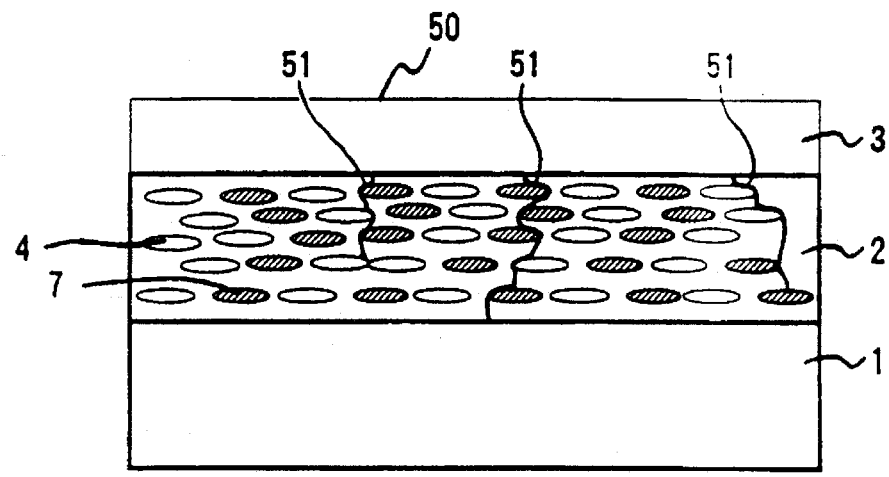
FIG. 5 is a view illustrating a metal base board according to the present invention.

Now description is made for a fifth embodiment of the present invention. As shown in FIG. 5, a metal base board 50 has the circuit conductor 3 formed via the insulating layer 2 on the upper surface of the metal plate 1. Flaky inorganic filler material 4 of a first type and a second type of flaky inorganic material are disposed in mixed form in the insulating layer 2. In an organic insulating material with the random mix of flaky inorganic fillers 4 and the flaky inorganic fillers 7 added therein, surfaces of the flaky inorganic filler materials 4 and 7 are aligned basically in parallel with the surfaces of the circuit conductor 3 and the metal plate 1, and the inorganic filler flakes are stacked in a stratified state. Namely any vector from a given point on the circuit conductor 3 to the metal plate 1 in the direction vertical to the circuit conductor 3 as seen from paths 51 will intersect with flakes of the flaky inorganic fillers 4 and 7. Any of, for instance, mica, boron nitride, flaky glass, and flaky alumina is used as a raw material for the flaky inorganic fillers 4 and 7 described above.

Also in this configuration, the electric discharge resistant characteristics are far better than that of conventional products. The mechanism for improving the electric discharge resistant characteristics in this embodiment and the method of aligning the direction of the inorganic fillers in one direction are basically the same as those in the first embodiments.

Semiconductor devices for power control such as transistors, resistors, and capacitors, which generates a large quantity of heat, are mounted on the metal base board having the construction as described above to build electronic equipment.

Figure 6:
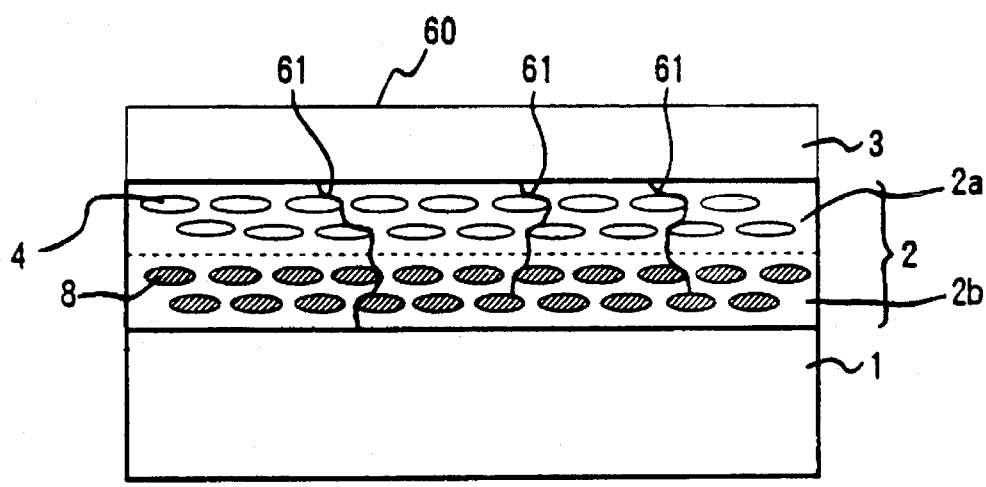
FIG. 6 is a view illustrating a metal base board according to the present invention.
Figure 7:
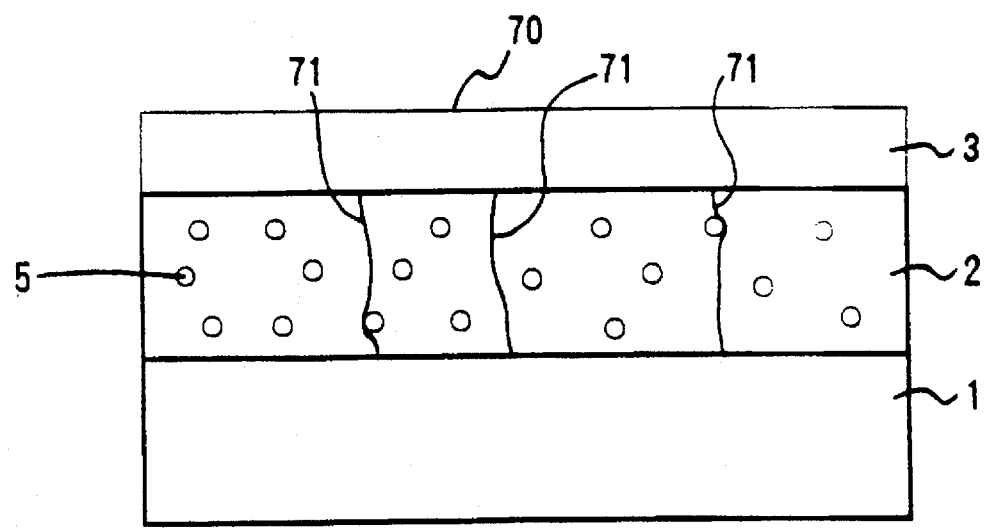
FIG. 7 is a view illustrating a metal base board according to the present invention.

Next description is made of a sixth embodiment of the present invention. As shown in FIG. 6, a metal base board 60 has the circuit conductor 3 formed via the insulating layer on the upper surface of the metal plate 1. The insulating layer 2 comprises the first insulating layer 2a and the second insulating layer 2b. The flaky inorganic fillers 4 are added in the first insulating layer 2a, and flaky inorganic fillers 8 made of a raw material different from that of the flaky inorganic fillers 4 added in the first insulating layer 2a are added in the second insulating layer 2b. With this arrangement, any vector from a given point on the circuit conductor 3 to the metal plate 1 in the direction vertical to the circuit conductor 3, as seen from paths 61 will intersect a flake of the flaky inorganic fillers 4 and 8. Any of, for instance, mica, boron nitride, flaky glass, and flaky alumina is used as a raw material for the flaky inorganic fillers 4 and 8 described above.

Surfaces of the flaky inorganic filler materials 4 in the insulating layer 2a and the flaky inorganic fillers 8 in the second insulating layer 2b are aligned basically in parallel with the surfaces of the circuit conductors 3 and the metal plate 1, and the fillers are stacked in a stratified state. Also in this configuration, the electric discharge resistant characteristics is far better than that of conventional products like in each of the embodiments described above. The mechanism for improving the electric discharge resistant characteristics in this embodiment and the method of aligning direction of the inorganic fillers in one direction is basically the same as those in the first and the third embodiments.

Semiconductor devices for power control such as transistors, resistors, and capacitors, which generates a large quantity of heat, are mounted on the metal base board having the construction as described above to build electronic equipment.

It should be noted that the metal base boards according to the present invention are not limited to those described in relation to the above embodiments and can be modified within the spirit of the present invention. In the embodiments described above, a circuit conductor is formed on only one side of the metal plate, but circuit conductors may be formed via an insulating layer on two sides of the metal plate. Also the metal base board shown in above third embodiment, fourth embodiment and sixth embodiment is comprised by two layers including an insulating layer, but the metal base board according to the present invention are not limited to two layer structure, and can be modified to the metal base board having plural layers.

As described above, in a metal base board and electronic equipment using the same therein, an insulating section comprises an organic insulating material with flaky inorganic fillers added therein, and the flaky inorganic fillers are stacked in a stratified state, so that, even if the insulating layer is degraded due to electric discharge, the degradation due to electric discharge is prevented by the flaky inorganic fillers added therein, and for this reason the electric discharge resistant characteristics is improved.

Also, in the metal base board according to the present invention and electronic equipment using the same therein, the insulating section comprises an organic insulating material with flaky inorganic fillers and a granular inorganic filler material added therein, and the flaky inorganic fillers are stacked in a stratified state. As a result, even if the insulating layer is degraded due to an electric discharge, the degradation due to electric discharge is prevented by the section with the flaky inorganic fillers added. For this reason, the electric discharge resistance characteristics are improved with the workability also raised. Further, the required performance can be satisfied by mixing inorganic fillers having various characteristics without being restricted by the flaky inorganic fillers.

Also in the metal base board according to the present invention and electronic equipment using the same therein, the insulating section comprises a first insulating layer made of an organic insulating material with flaky inorganic fillers added therein and a second insulating layer made of an organic insulating material with granular inorganic filler material added therein, and the flaky inorganic filler materials are stacked in a stratified state. As a result, even if the insulating layer is degraded due to electric discharge, the degradation due to electric discharge is prevented by the flaky inorganic filler materials. For this reason, the electric discharge resistance characteristics is improved with the workability also raised, and a required performance can be satisfied by mixing inorganic filler materials having various characteristics without being restricted by the flaky inorganic filler materials.

Also in the metal base board according to the present invention and electronic equipment using the same therein, the insulating section comprises an organic insulating material with flaky inorganic fillers made of a plurality of different types of materials added therein, and the flaky inorganic fillers are stacked in a stratified state. Accordingly, even if the insulating layer is degraded due to electric discharge, the degradation due to electric discharge is prevented by the section with the flaky inorganic fillers added. For this reason the electric discharge resistance characteristics are improved with the workability also raised, and a required performance can be satisfied by mixing inorganic filler materials having various characteristics without being restricted by the flaky inorganic fillers.

Also in the metal base board according to the present invention and electronic equipment using the same therein, the insulating section comprises a plurality of insulating layers, the insulating layers comprise an organic insulating material with flaky inorganic filler materials made of a different material respectively added therein, and the flaky inorganic fillers are stacked in a stratified state. Accordingly, even if the insulating layer is degraded due to electric discharge, the degradation due to electric discharge is prevented by the section with the flaky inorganic fillers added therein. For this reason the electric discharge resistance characteristics are improved with the workability also raised, and a required performance can be satisfied by mixing inorganic filler materials having various characteristics without being restricted by the flaky inorganic filler materials.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A metal baseboard, comprising:

a metallic base section;

a circuit conductor section; and an insulating section provided between said circuit conductor section and said base section;

said insulating section comprising a plurality of insulating layers, at least two of said insulating layers comprising an organic insulating material with respective flaky inorganic filler material made of a different raw material respectively added therein, said flaky inorganic fillers being disposed in said insulating section in a substantially parallel relation to each other, wherein said flaky inorganic material is stacked in a plurality of layers having a total thickness of approximately 0.12 mm.

2. A metal baseboard, comprising:

a metallic base section;

a circuit conductor section; and an insulating section provided between said circuit conductor section and said base section;

said insulating section comprising a plurality of insulating layers, at least two of said insulating layers comprising an organic insulating material with respective flaky inorganic filler material made of a different raw material respectively added therein, said flaky inorganic fillers being disposed in said insulating section in a substantially parallel relation to each other;

wherein said flaky inorganic filler material is stacked so that all vectors from any point on the circuit conductor section to the metallic base section in a direction vertical to the circuit conductor section will intersect some of said flaky inorganic filler material.

3. Electronic equipment, comprising:

a metal base board having a metallic base section, a circuit conductor section, and an insulating section provided between said circuit conductor section and said base section;

said insulating section comprising a plurality of insulating layers, at least two of said insulating layers, comprising an organic insulating material with respective flaky inorganic fillers made of a different raw material respectively added therein, said flaky inorganic fillers being disposed in said insulating section in a substantially parallel relation to each other;

wherein said flaky inorganic filler material is stacked so that all vectors from any point on the circuit conductor section to the metallic base section in a direction vertical to the circuit conductor section will intersect some of said flaky inorganic filler material.

* * * * *